(12) United States Patent
Sandhu et al.

(10) Patent No.: US 7,375,004 B2
(45) Date of Patent: May 20, 2008

(54) METHOD OF MAKING AN ISOLATION TRENCH AND RESULTING ISOLATION TRENCH

(75) Inventors: Sukesh Sandhu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/372,092

(22) Filed: Mar. 10, 2006

(65) Prior Publication Data

US 2007/0212848 A1 Sep. 13, 2007

(51) Int. Cl.
*H01L 21/76* (2006.01)
(52) U.S. Cl. ............... 438/424; 438/435; 438/436; 257/E21.548; 257/E21.549; 257/E21.579; 257/E21.577; 257/E21.628
(58) Field of Classification Search ............... 438/436, 438/435; 257/E21.548, E21.549, E21.579
See application file for complete search history.

(56) References Cited

U.S. PATENT DOCUMENTS

| | | | | |
|---|---|---|---|---|
| 4,472,240 A | * | 9/1984 | Kameyama | 438/427 |
| 5,895,253 A | * | 4/1999 | Akram | 438/424 |
| 6,140,156 A | * | 10/2000 | Tsai | 438/148 |
| 6,150,212 A | * | 11/2000 | Divakaruni et al. | 438/244 |
| 6,180,490 B1 | * | 1/2001 | Vassiliev et al. | 438/424 |
| 6,207,532 B1 | * | 3/2001 | Lin et al. | 438/424 |
| 6,461,937 B1 | * | 10/2002 | Kim et al. | 438/431 |
| 6,734,082 B2 | * | 5/2004 | Zheng et al. | 438/435 |
| 6,828,210 B2 | * | 12/2004 | Kim et al. | 438/424 |
| 6,849,919 B2 | * | 2/2005 | Sumino et al. | 257/510 |
| 6,967,146 B2 | | 11/2005 | Dickerson et al. | |
| 7,112,513 B2 | * | 9/2006 | Smythe et al. | 438/431 |

* cited by examiner

*Primary Examiner*—Michael Lebentritt
*Assistant Examiner*—Ron E Pompey
(74) *Attorney, Agent, or Firm*—Dickstein Shapiro LLP

(57) ABSTRACT

A method of forming and resulting isolation region, which allows for densification of an oxide layer in the isolation region. One exemplary embodiment of the method includes the steps of forming a first trench, forming an oxide layer on the bottom and sidewalls of the trench, forming nitride spacers on the lined trench, and thereafter etching the silicon beneath the first trench to form a second trench area. An oxide layer is then deposited to fill the second trench. Densificiation of the isolation region is possible because the silicon is covered with nitride, and therefore will not be oxidized. Light etches are then performed to etch the oxide and nitride spacer area in the first trench region. A conventional oxide fill process can then be implemented to complete the isolation region.

28 Claims, 7 Drawing Sheets

METHOD OF MAKING AN ISOLATION TRENCH AND RESULTING ISOLATION TRENCH

FIELD OF THE INVENTION

The present invention relates to the field of semiconductor devices and, in particular, to methods for forming trench isolation regions in semiconductor devices.

BACKGROUND OF THE INVENTION

Typically in semiconductor device applications, numerous devices are packed into a small area of a semiconductor substrate to create an integrated circuit. Generally, these devices need to be electrically isolated from one another to avoid problems among the devices. Accordingly, electrical isolation is an important part of semiconductor device design to prevent unwanted electrical coupling between adjacent components and devices.

Shallow trench isolation (STI) is one conventional isolation method. Shallow trench isolation provides very good device-to-device isolation. A shallow trench isolation process generally includes the following steps. First, a trench is formed in a semiconductor substrate using wet or dry etching with a mask. Then, an insulating layer is deposited on the entire surface of the semiconductor substrate to fill the trench. Finally, chemical mechanical polishing (CMP) is used to planarize the insulating layer. The insulating layer remaining in the trench acts as an STI region for providing isolation among devices in the substrate. Additionally, a nitride and/or oxidation layer may be formed on the sidewalls and bottom of the trench before depositing the insulating layer.

As semiconductor devices get smaller and more complex and packing density increases, the width of the STI regions also decreases. In addition, for certain types of electronic devices, a deeper isolation trench is desired. This leads to trench isolation regions with high aspect ratios; aspect ratio refers to the height of the trench compared to its width (h:w). An aspect ratio of greater than or equal to about 3:1 is generally considered a high aspect ratio. Even when filling an isolation trench with a high-density plasma having good filling capability, voids or seams may still exist in the isolation regions. These defects cause electrical isolation between the devices to be reduced. Poor isolation can lead to short circuits and can reduce the lifetime of one or more circuits formed on a substrate.

FIG. 1 illustrates a high aspect ratio isolation trench 11 formed in a semiconductor substrate 10 in accordance with the prior art. Before forming the isolation trench 11, other layers may be deposited over the semiconductor substrate 10, for example, layers used to form gate structure, including an oxide layer 12, a polysilicon layer 14, and a nitride layer 16. After a trench 11 is formed, an insulating layer 20 is deposited over the semiconductor substrate 10 to fill the trench 11. The insulating layer 20 can be deposited using high-density plasma chemical vapor deposition (HPDCVD). Due to the high aspect ratio of the trench 11, the HPDCVD process will leave void regions 22 in the insulating layer 20. This occurs because in the process of depositing the insulating layer 20, the insulating layer 20 on the sidewalls at the top of the trench 11 grows thicker than the portion closer to the bottom of the trench 11. Therefore, the opening at the top of the trench 11 becomes closed-off before the entire volume of the trench 11 can be filled, causing the void regions 22 which diminishes the isolation properties of the filled trench 11.

One other problem that has been experienced during known trench formation is that silicon and/or polysilicon becomes oxidized when exposed to high ambient temperatures, such as when put in a furnace for steam densification. This oxidation results in undesirable changes to the properties of the oxidized material.

Accordingly, there is a need and desire for a method of forming shallow trench isolation region that achieves good isolation, but minimizing the drawbacks experienced with conventional trench isolation formation.

BRIEF SUMMARY OF THE INVENTION

The invention provides a method of forming isolation regions in a semiconductor device, which provides good isolation without sacrificing performance of the semiconductor device, even when exposed to high temperatures during formation of the isolation region or operation of the device. In one exemplary embodiment, a method includes the steps of forming a trench, forming an oxide layer on the bottom and sidewalls of the trench, forming nitride sidewalls in the trench, etching a deeper trench region at the bottom of the trench, forming a second oxide layer, densifying the region, and then filling the trench.

These and other features of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The present invention relates to a robust method of forming a trench isolation region, which may be a high-aspect ratio trench isolation region, in a semiconductor device, that provides good isolation without sacrificing performance of the semiconductor device, even when exposed to high temperatures during isolation region formation. Specifically, the formation of the isolation region in accordance with exemplary embodiments of the invention allows the densification of the trench region in a way that does not oxidize the underlying silicon. The resulting structure provides a more robust, high-aspect ratio isolation region than conventional trench formation methods.

Now, with reference to the figures where like numerals designate like elements, FIGS. 2-9 depict a method for forming a trench isolation region. The trench isolation region is part of a semiconductor device 150, which may be part of a memory array, including, but not limited to a flash memory array as shown in FIG. 10, and described below.

Figure 1:
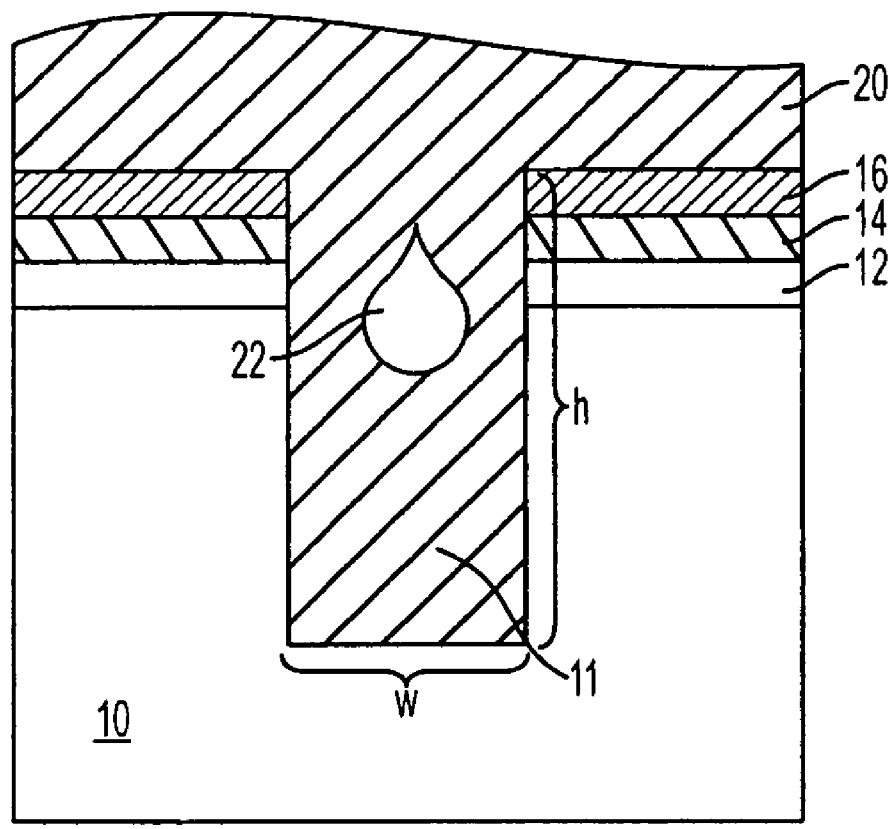
FIG. 1 depicts a prior art semiconductor substrate including a high aspect ratio isolation trench.
Figure 2:
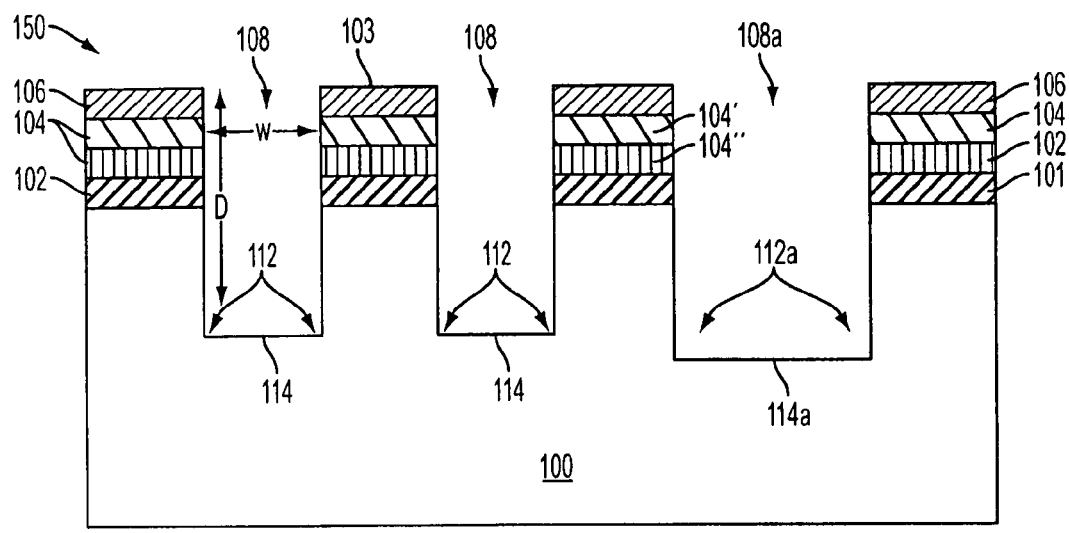
FIG. 2 is a view of a semiconductor device with a trench formed in a semiconductor substrate at a first stage of processing, in accordance with an exemplary method of the present invention.

FIG. 2 depicts a first step in the exemplary method of forming trench isolation regions. Unfilled trenches 108 to be used as an isolation region are formed in a semiconductor substrate 100. The trenches 108 may be shallower in the substrate 100, i.e., have a lower aspect ratio (less than 3:1), than the trench 11 illustrated in FIG. 1. Shallower trenches are easier to fill with known HDP-CVD techniques. It should be understood, however, that the invention is in no way limited to the depth or the aspect ratio of the trenches 108.

Before forming the trenches 108, various semiconductor structures 103 may be formed on the surface of the substrate 100. The structures 103 may be, but are not limited to, structures 103 used to form gate devices for transistors. Although not shown in this cross-sectional view, the structures 103 could have source/drain regions formed on either side in the substrate 100 to form transistors. It should be understood that the method need not include first forming structures 103, but rather, trenches 108, 108a could be formed in the surface of the substrate 100 without structures 103.

In one embodiment, the structures collectively shown as stack 103 include a gate oxide 101 which is deposited on or near the upper surface of the substrate 100. A polysilicon 102, or other conductive layer, is formed over and in contact with the gate oxide layer 101. A nitride layer 104 is formed over the polysilicon layer 102 and serves as an insulating layer. A second insulating layer 106 may be formed over the nitride layer 104.

The isolation trench 108 is formed by any method known in the art that is suitable for forming a high aspect ratio trench 108. For example, the trench 108 may be formed by etching the substrate 100 to a depth D and having a width W. The resulting trench 108 has sidewalls 112 terminating at a bottom 114. The trench 108 may be a high aspect ration trench, meaning the depth D is large in comparison to the width W of the trench 108. The depth to width ration may be greater than or equal to 3:1. The depth, in a preferred embodiment, is within the range of about 500 to about 1500 Angstroms.

The trenches 108 form part of an array of structures, such as a memory array, e.g., a flash memory array. As such, the two left-most trenches 108 in FIG. 2 depict portions of the memory array while the right-most trench 108a depicts a trench which isolates an active memory area in the array from the periphery or isolates periphery devices from one another. As shown, the periphery trench 108a may be wider, and deeper, having sidewalls 112a that are farther apart than the other trenches 108 in the active areas of the device 150. The periphery trench 108a may be in the range of about 300 to about 700 Angstroms deeper than the trenches 108 in active, non-peripheral, areas in the array. In an alternative embodiment, each of the trenches 108, 108a may be formed having identical dimensions.

Figure 3:
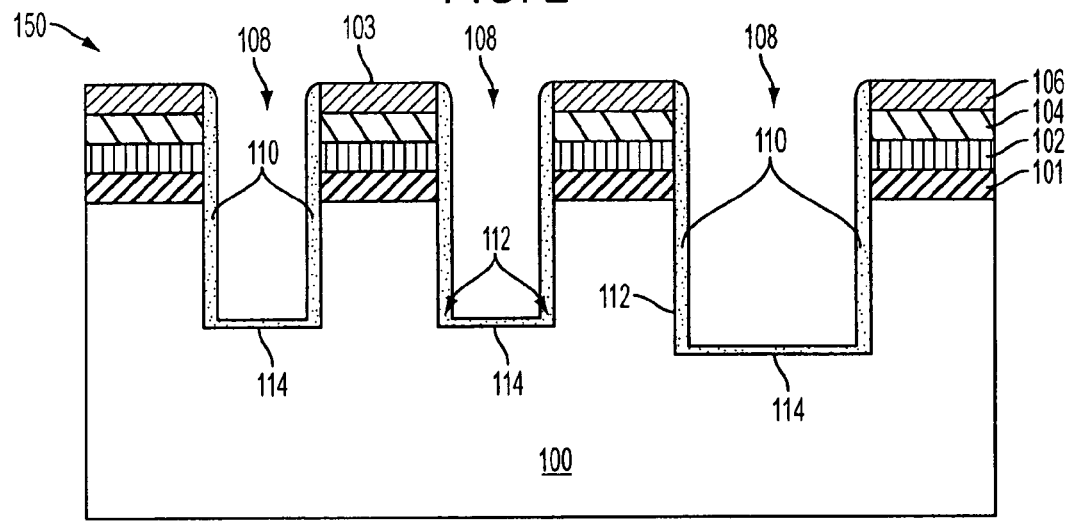
FIG. 3 is a view of the FIG. 2 semiconductor device at a processing stage subsequent to FIG. 2, in accordance with an exemplary embodiment of the invention.

Referring now to FIG. 3, an oxide layer 110 is formed on the sidewalls 112 and bottom 114 of the isolation trenches 108, 108a to form a trench liner. FIG. 3 shows the resultant oxide layer 110 formed, for example, by growing an oxide layer 110 in the desired area. In a preferred embodiment, the oxide layer 110 is an it-situ steam generation growth (ISGG) oxide layer, formed using any known ISGG formation process. In an alternative embodiment, the oxide layer 110 may be deposited over the device 150, including the trench sidewalls 112, 112a and bottom 114, 114a and can be etched to form oxide layer 110 within the trenches 108, 108a.

Figure 4:
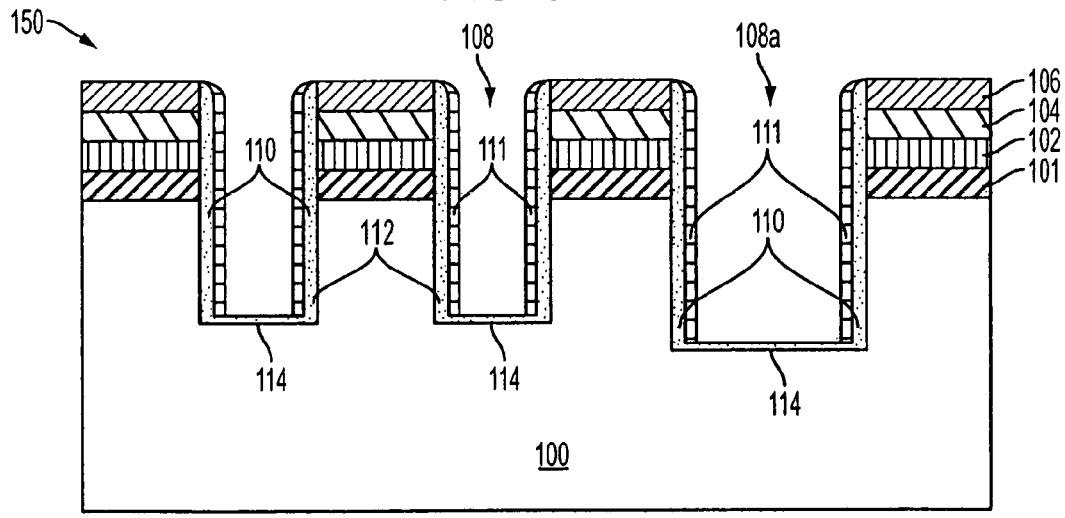
FIG. 4 is a view of the FIG. 3 semiconductor device at a processing stage subsequent to FIG. 3, in accordance with the exemplary embodiment of the invention.

Next, as shown in FIG. 4, nitride spacers 111 are formed in the trenches 108, 108a. The nitride spacers 111 can be formed using known techniques, including deposition and selective etching of a nitride-containing material. The nitride spacers 111 form rounded edges at the top of the sidewalls 112, 112a of the trenches 108, 108a, and in a preferred embodiment, are etched and removed from the bottom of the trenches 114, 114a. The nitride spacers 111 may have a width within the range of about 50 to about 150 Angstroms. It should be understood that the width of the nitride spacers 111 will depend on the width W of the trench 108, 108a. In addition, materials other than nitride, including but not limited to $Al_2O_3$ and $HfO_2$, may be used, and can be selected according to the filler material and method.

Figure 5:
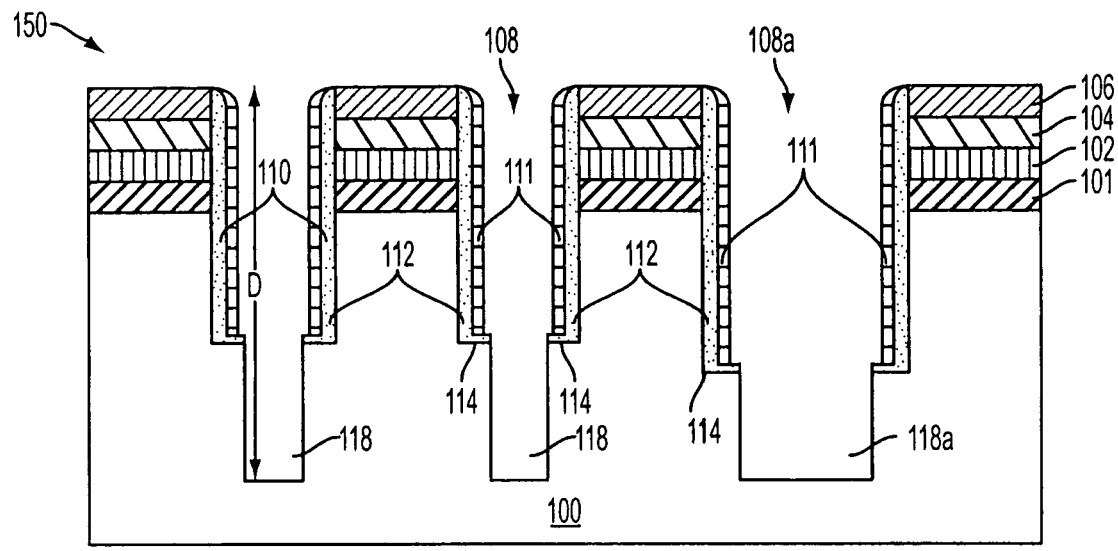
FIG. 5 is a view of the FIG. 4 semiconductor device at a processing stage subsequent to FIG. 4, in accordance with the exemplary embodiment of the invention.

As shown in FIG. 5, an etching process is next used at the bottom 114, 114a of the isolation trenches 108, 108a, etching a second, deeper and narrower trench region 118 into the substrate 100. The etching process also removes part of the oxide liner layer 110 which covers the bottom of the trench 108. Any etching method known in the art may be used. The bottom trench region 118 may go into the substrate 100 to a total depth D within the range of about 1000 to about 2000 Angstroms. This increases the aspect ratio for the isolation regions. In the illustrated embodiment, a bottom trench 118a is also formed at the bottom 114 of the array trench regions 108a. The periphery bottom trench 118a may be formed to a depth that is the same, less than, or greater than the depth of the bottom trenches 118 associated with the non-peripheral trench regions 108. In a preferred embodiment, the periphery trenches are deeper because of etch loading effect. This improves the isolation of the periphery area.

Figure 6:
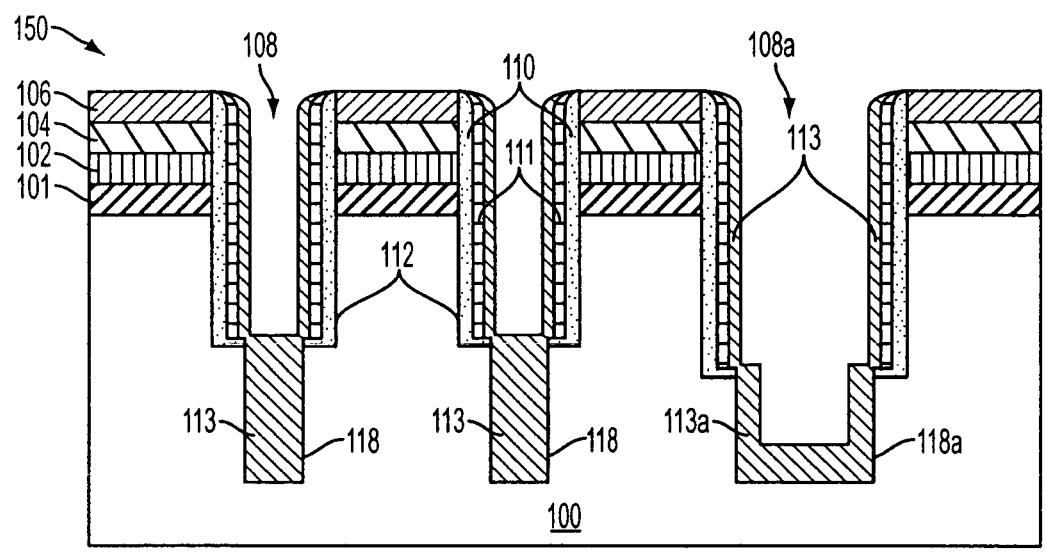
FIG. 6 is a view of the FIG. 5 semiconductor device at a processing stage subsequent to FIG. 5, in accordance with the exemplary embodiment of the invention.

Next, as shown in FIG. 6, a selective oxide layer 113 is formed in the openings for the trench 108 and the bottom trench 118. As shown, the oxide layer 113 may be formed on the sidewalls 112 of the first trench regions 108. For the non-array trench regions 108, the bottom trench region 118 may be completely filled with the oxide layer 113. For the peripheral trench regions 108a, the bottom trench 118a may only be partially filled, as shown. Thus, the oxide layer 113a may only be formed on the sidewalls of the bottom trench region 118a. This leaves a deep opening for the peripheral trench region, which includes trench 108a and bottom trench 118a.

In one embodiment, the oxide layer 113 is formed of a layer of tetraethyl orthosilicate (TEOS), which can be selectively deposited in the trench regions. The TEOS oxide layer 113 may be within the range of 50 to about 150 Angstroms thick on the sidewalls 112, and may be a layer as thick as the bottom trench 118 is deep.

After the oxide layer 113 is formed, a step for densification in an oxygen atmosphere or steam may be possible if desired. Furnace oxidation can be used to densify the oxide fill in the trench without oxidizing the silicon because nitride layer 111 serves to protect the silicon. This is one advantage of the described fill process. The semiconductor device 150 can be heated to high temperatures, which may be greater than 1000° C., without experiencing unwanted changes in the characteristics of the device 150.

Figure 7:
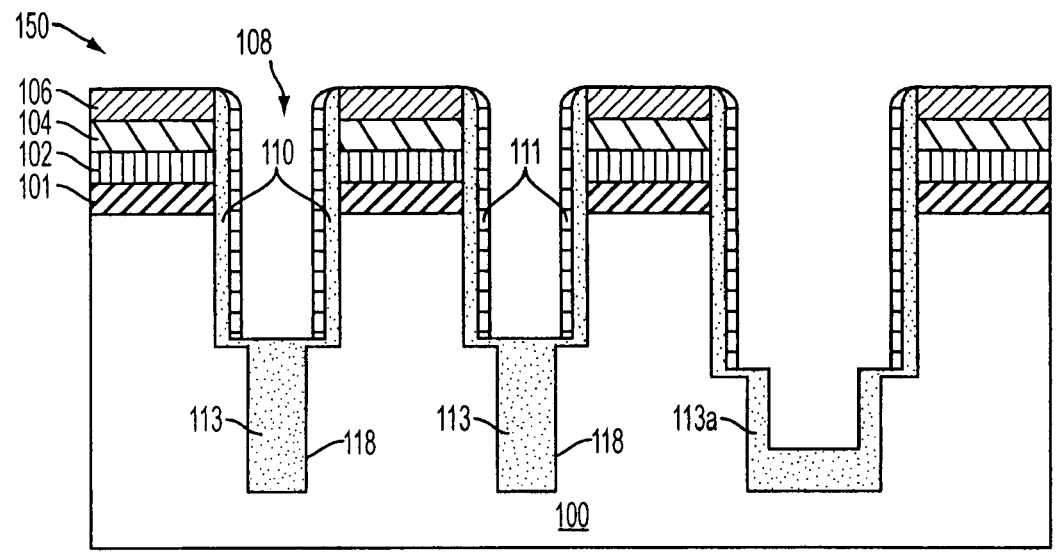
FIG. 7 is a view of the FIG. 6 semiconductor device at a processing stage subsequent to FIG. 6, in accordance with the exemplary embodiment of the invention.

After the densification, a light wet etch back is performed to remove some of the deposited oxide 113. The etch step in accordance with one embodiment is timed, and as shown in FIG. 7, may remove a significant amount of oxide from the bottom trench 118a in the periphery region and from the sidewalls of the trenches 108, 108a. Any known conditions for performing a wet etch for oxide may be utilized at this step.

Figure 8:
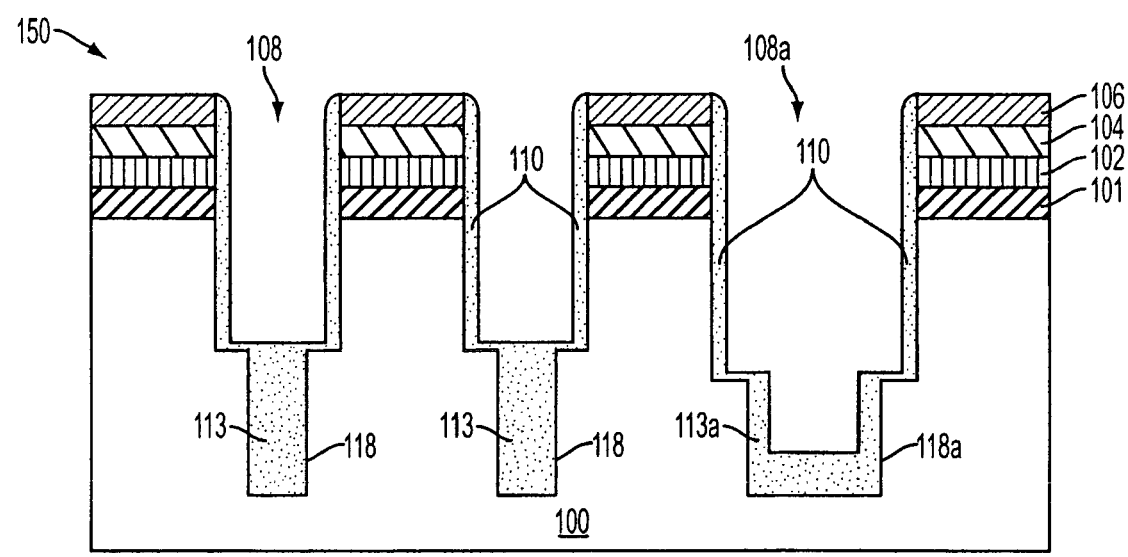
FIG. 8 is a view of the FIG. 7 semiconductor device at a processing stage subsequent to FIG. 7, in accordance with the exemplary embodiment of the invention.

Thereafter, as shown in FIG. 8, a nitride wet etch is performed to remove some of the nitride spacer 111 material that resides on the sidewalls 112 of the trench regions 108, 108a. Thus, the trenches 108, 108a have nearly the same width W as when they were initially formed (with reference to FIG. 2). The nitride wet etch may be performed under known conditions.

Figure 9:
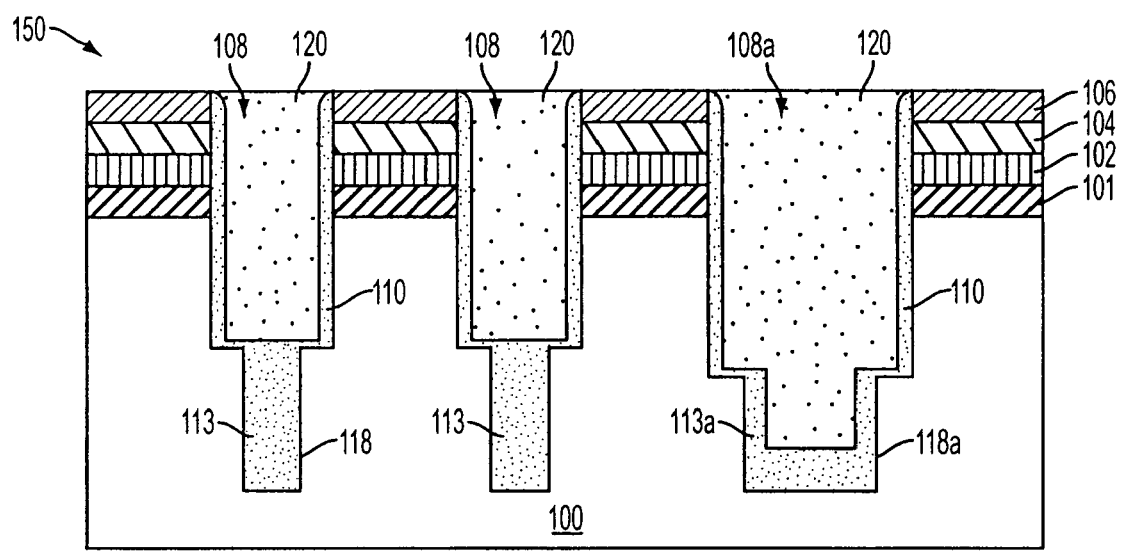
FIG. 9 is a view of the FIG. 8 semiconductor device at a processing stage subsequent to FIG. 8, in accordance with the exemplary embodiment of the invention.
Figure 10:
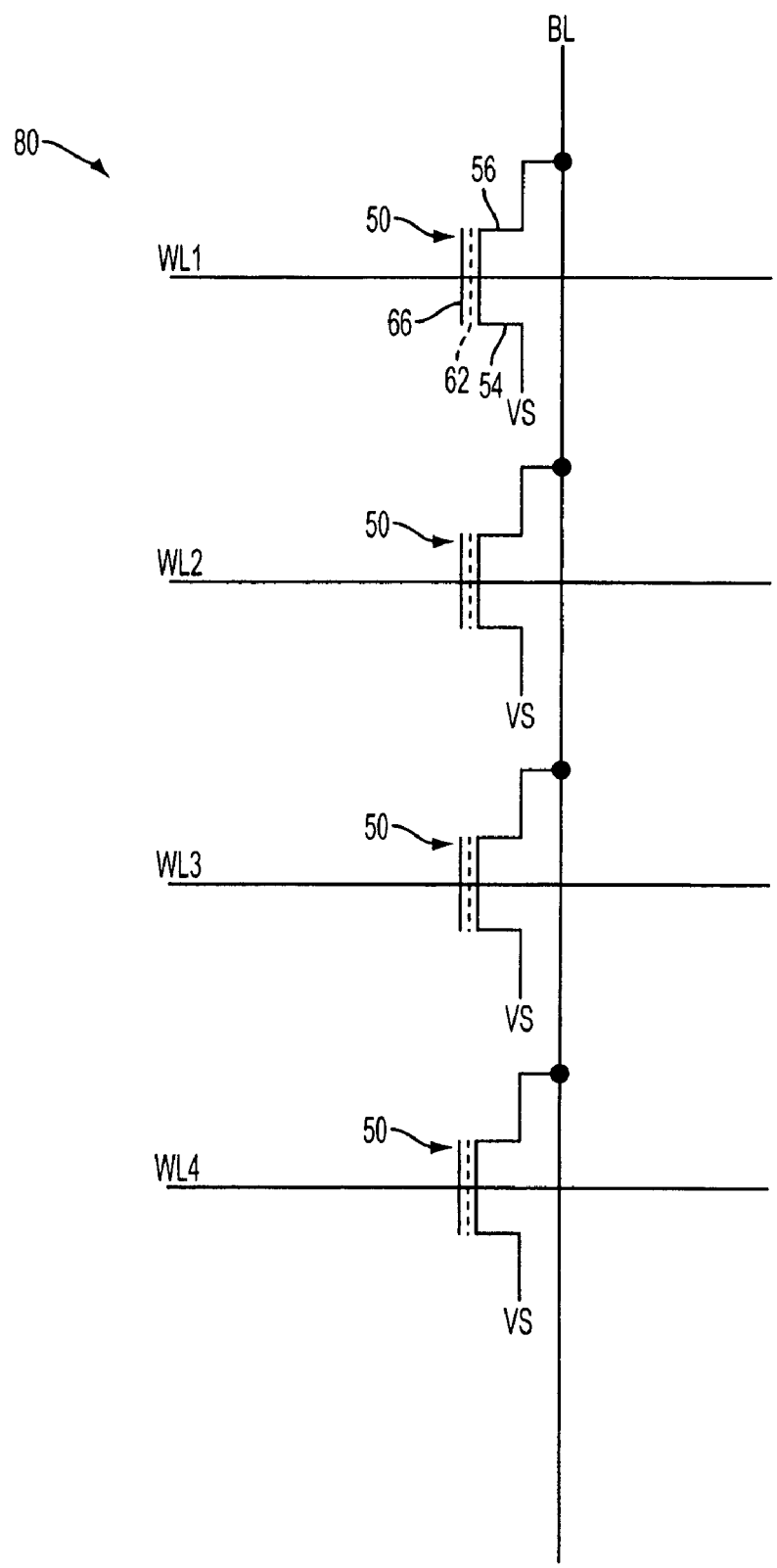
FIG. 10 is a view of the structure of a memory array in a conventional NAND type flash memory.

After the etch steps, an oxide layer 120 is deposited over the semiconductor substrate 100, in such a way as to fill the isolation trenches 108, 108a and 118a, as shown in FIG. 9. This oxide layer 120 can be formed by a high density plasma chemical vapor deposition (HDP-CVD) process in the preferred embodiment, but may alternatively be done by any other method known in the art. The oxide layer 120 does not have any voids or gaps (such as those present in the prior art oxide layer) because of the benefits of having shallow upper trench regions 108, 108a, which can easily be filled with HDP-CVD. In addition, densification of fill materials in the deeper trenches is possible because silicon areas are covered, and therefore, will not be oxidized.

As is known in the art, the oxide layer 120 is subsequently planarized to complete the filling of the isolation trench 108 (and the peripheral trench 108a). This can be done by chemical mechanical polishing (CMP) the surface of the oxide layer 120 or by any method known in the art.

In accordance with one embodiment utilizing the invention, the semiconductor device 150 is a memory device. The trench isolation region formed by the method of the present invention may be incorporated to separate adjacent memory cells 50, active areas within one memory cell, a memory cell 50 from the periphery of a memory array 80, or active areas within the periphery of the array. The memory array 80 illustrated in FIG. 10 may be a portion of a flash memory array comprised of numerous flash memory cells. The invention can be used to isolate flash memory cells in the array and the array from the peripheral logic. The flash memory cell arrays incorporating isolation trenches 108, 108a, may be formed in accordance with known methods, including those described in U.S. Pat. No. 6,977,842, assigned to Micron Technology, Inc., and incorporated herein by reference.

The flash memory cells 50 may be of any conventional construction. Illustrated in FIG. 10, each cell 50 has its drain region 56 connected to the same bit line BL. Each cell 50 has its control gate 66 connected to a respective word line WL1, WL2, WL3, WL4. Each cell 50 has its source region 54 connected to a source voltage VS. The configuration of the column 80 of memory cells 50 is what is known in the art as a NOR-type configuration. It should be noted that the column 80 can contain numerous cells 50, with each cell 50 connected to a respective word line, and that only four cells 50 are illustrated for clarity purposes. However, the invention is not limited to flash memory or to NOR flash memory, and it may be used with other types of memory, including NAND flash memory, or other memory arrays and devices, as well as in any semiconductor device where isolation is required.

Figure 11:
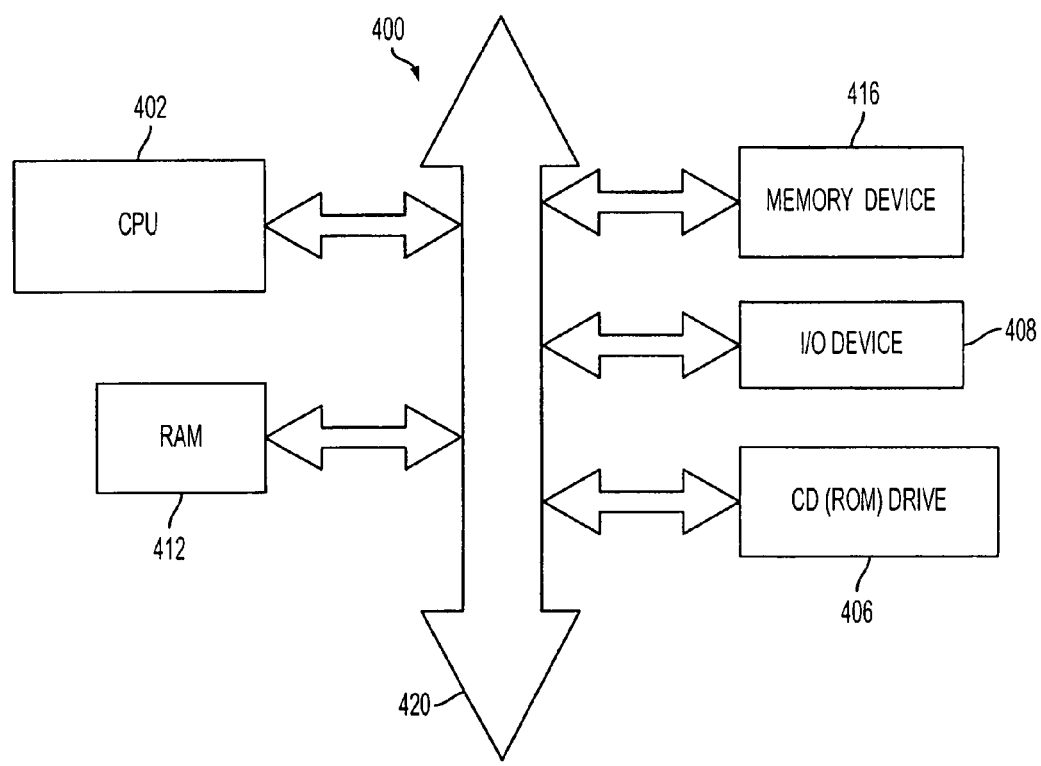
FIG. 11 is a block diagram of a computer system using a memory cell device having trench isolation regions formed by the exemplary method shown in FIGS. 2-9.

FIG. 11 is a block diagram of a processor system 400 utilizing a memory device 416, which may be a flash memory device, constructed in accordance with the present invention. That is, the flash memory device 416 has cells that contain or are separated by a trench isolation region constructed in accordance with the invention. The processor system 400 may be a computer system, a process control system or any other system employing a processor and associated memory. The system 400 includes a central processing unit (CPU) 402, e.g., a microprocessor, that communicates with the flash memory 416 and an I/O device 408 over a bus 420. It must be noted that the bus 420 may be a series of buses and bridges commonly used in a processor system, but for convenience purposes only, the bus 420 has been illustrated as a single bus. A second I/O device 410 is illustrated, but is not necessary to practice the invention. The processor system 400 also includes random access memory (RAM) device 412 and may include a read-only memory (ROM) device (not shown), and peripheral devices such as a (CD) ROM drive 406 that also communicate with the CPU 402 over the bus 420 as is well known in the art.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed is:

1. A method of forming a trench isolation region comprising:
    forming a first trench, having sidewalls and a bottom, to a first depth in a substrate;
    forming a first oxide layer on the sidewalls of the first trench;
    forming a nitride layer in the first trench at least partially over the first oxide layer;
    forming a second trench at the bottom of the first trench, to a second depth in the substrate;

forming a second oxide layer in the first and second trenches at least partially over the nitride layer;

densifying the second oxide layer;

removing at least a portion of the second oxide layer and nitride layer before filling the first and second trenches; and filling the first and second trenches with an insulating material.

2. The method of claim 1, wherein the second oxide layer comprises TEOS.

3. The method of claim 1, wherein the act of removing at least a portion of the second oxide layer comprises wet etching.

4. The method of claim 3, wherein the act of removing at least a portion of the nitride layer comprises wet etching.

5. The method of claim 1, wherein the act of densifying the second oxide layer is performed in one of an oxygen or steam atmosphere.

6. The method of claim 1, wherein the act of filling the first and second trenches comprises filling the trenches with a high density plasma oxide.

7. The method of claim 6, wherein the act of filling the first and second trenches comprises a high density plasma chemical vapor deposition of an oxide layer.

8. The method of claim 1, further comprising the act of planarizing the insulating material after the first trench is filled.

9. A method of forming isolation trenches for a semiconductor device comprising the acts of:

forming at least one array isolation trench between two active regions of an array area in the semiconductor device to a first depth in a semiconductor substrate;

forming at least one periphery isolation trench in a periphery area outside said array area to a second depth in the substrate;

forming a first oxide layer in the at least one array isolation trench and the at least one periphery isolation trench;

forming a nitride layer at least partially over the first oxide layer;

forming a second isolation trench at the respective bottoms of each of the at least one array isolation trench and at least one periphery isolation trench;

forming a second oxide layer at least partially over the nitride layer;

densifying the second oxide layer;

removing at least a portion of the second oxide layer and nitride layer before filling the second isolation trenches, the at least one array isolation trench and the at least one periphery isolation trench; and filling the second isolation trenches, the at least one array isolation trench and the at least one periphery isolation trench with an insulating material.

10. The method of claim 9, wherein the second isolation trenches are formed to the same depth in the substrate.

11. The method of claim 9, wherein the second isolation trenches are formed to different depths in the substrate.

12. The method of claim 9, wherein the depth of the second isolation trench formed at the bottom of the at least one periphery isolation trench is greater than the depth of the second isolation trench formed at the bottom of the at least one array isolation trench.

13. The method of claim 9, wherein the act of forming at least one array isolation trench between two active regions in the array area comprises forming more than one array isolation trench in the substrate, each array isolation trench being formed between two active regions.

14. The method of claim 9, wherein the second oxide layer is formed in the at least one periphery isolation trench, the second isolation trench formed at the bottom of the at least one periphery isolation trench, the at least one array isolation trench, and the second isolation trench formed at the bottom of the at least one array isolation trench.

15. The method of claim 14, wherein the second oxide layer comprises TEOS.

16. The method of claim 14, wherein the act of removing at least a portion of the second oxide layer comprises wet etching.

17. The method of claim 16, wherein the act of removing at least a portion of the nitride layer comprises wet etching.

18. The method of claim 9, wherein the act of densifying the second oxide layer is performed in one of an oxygen or steam atmosphere.

19. The method of claim 9, wherein the second oxide layer comprises a high density plasma oxide.

20. A method of forming a flash memory device comprising:

forming active flash memory elements on a semiconductor substrate in an array area;

forming integrated circuitry connectable to receive outputs from said flash memory elements in a periphery area of the semiconductor substrate; and forming at least one trench isolation region in the semiconductor substrate by the acts of:

forming a first trench to a first depth in the substrate;

forming a first oxide layer on the sidewalls of the first trench;

forming a nitride layer at least partially over the first oxide layer;

forming a second trench at the bottom of the first trench, to a second depth in the substrate;

forming a second oxide layer at least partially over the nitride layer;

densifying the second oxide layer;

etching at least a portion of the second oxide layer and the nitride layer before filling the first and second trenches; and filling the first and second trenches with an insulating material.

21. The method of claim 20, wherein the act of forming the first trench is performed in said periphery area.

22. The method of clam 21, further comprising the act of forming a second trench isolation region in said substrate near at least one active memory element.

23. The method of claim 22, wherein the depth of the second trench isolation region is deeper than the depth of the first trench isolation region.

24. The method of claim 20, wherein etching at least one of the formed second oxide layer and the nitride layer comprises a wet etch back to remove all of the nitride layer.

25. A method of forming an isolation trench comprising:

forming a first trench to a first depth in the substrate;

forming a first oxide layer directly on the walls of the first trench;

forming a nitride layer directly on at least part of the first oxide layer;

forming a second trench at the bottom of the first trench to a second depth in the substrate;

forming a second oxide layer directly on at least part of the nitride layer in the first trench and in the second trench;

densifying the second oxide layer; and etching at least a portion of said second oxide layer and said nitride layer before filling the first trench and the second trench with an insulating material.

26. The method of claim 25 further wherein etching at least a portion of said second oxide layer and said nitride layer comprises removing all of the nitride layer.

27. The method of claim 25, wherein the insulating material is a high density plasma oxide.

28. The method of claim 25, wherein the acts of filling the first trench and second trench comprise a high density plasma chemical vapor deposition of an oxide layer.

* * * * *

UNITED STATES PATENT AND TRADEMARK OFFICE
CERTIFICATE OF CORRECTION

PATENT NO. : 7,375,004 B2 Page 1 of 1
APPLICATION NO. : 11/372092
DATED : May 20, 2008
INVENTOR(S) : Sandhu et al.

It is certified that error appears in the above-identified patent and that said Letters Patent is hereby corrected as shown below:

On the face page, in field (57), under "Abstract", in column 2, line 9, delete "Densificiation" and insert -- Densification --, therefor.

Signed and Sealed this

Sixteenth Day of September, 2008

JON W. DUDAS
*Director of the United States Patent and Trademark Office*